(12) United States Patent
Shin et al.

(10) Patent No.: US 10,877,302 B2
(45) Date of Patent: Dec. 29, 2020

(54) COVER WINDOW OF A FLEXIBLE DISPLAY DEVICE AND METHOD OF MANUFACTURING A COVER WINDOW OF A FLEXIBLE DISPLAY DEVICE

(71) Applicant: Samsung Display Co., Ltd., Yongin-si (KR)

(72) Inventors: Heonjung Shin, Hwaseong-si (KR); Hye-Jin Oh, Asan-si (KR); Jeoungsub Lee, Seoul (KR); Min-Hoon Choi, Seoul (KR); Kyungtae Kim, Asan-si (KR); Boa Kim, Icheon-si (KR); Sanghoon Kim, Hwaseong-si (KR); Sang-Il Park, Yongin-si (KR); Hyun Joon Oh, Seongnam-si (KR); Junghoon Han, Uiwang-si (KR)

(73) Assignee: Samsung Display Co., Ltd., Yongin-si (KR)

(*) Notice: Subject to any disclaimer, the term of this patent is extended or adjusted under 35 U.S.C. 154(b) by 116 days.

(21) Appl. No.: 15/978,023

(22) Filed: May 11, 2018

(65) Prior Publication Data

US 2018/0348567 A1 Dec. 6, 2018

(30) Foreign Application Priority Data

Jun. 2, 2017 (KR) .................. 10-2017-0069037

(51) Int. Cl.
*G02F 1/1333* (2006.01)
*H01L 51/52* (2006.01)
*H01L 27/12* (2006.01)

(52) U.S. Cl.
CPC .. *G02F 1/133305* (2013.01); *G02F 1/133308* (2013.01); *H01L 27/1262* (2013.01); *H01L 51/524* (2013.01); *G02F 2001/133331* (2013.01); *H01L 2251/5338* (2013.01)

(58) Field of Classification Search
CPC ......... G02F 1/133305; G02F 1/133308; G02F 2001/133331; H01L 27/1262; H01L 51/524; H01L 2251/5338; G09F 9/301
See application file for complete search history.

(56) References Cited

U.S. PATENT DOCUMENTS

| | | | |
|---|---|---|---|
| 5,714,218 A * | 2/1998 | Nishio | C08F 290/064 428/523 |
| 2001/0033913 A1* | 10/2001 | Murata | G02B 5/0226 428/143 |
| 2002/0031645 A1* | 3/2002 | Sano | B05D 1/00 428/143 |
| 2004/0223220 A1* | 11/2004 | Kawanishi | B23H 9/04 359/487.05 |

(Continued)

FOREIGN PATENT DOCUMENTS

| | | |
|---|---|---|
| KR | 10-2016-0066679 A | 6/2016 |
| KR | 10-2017-0015021 A | 2/2017 |

*Primary Examiner* — Nathan L Van Sell
(74) *Attorney, Agent, or Firm* — Lewis Roca Rothgerber Christie LLP

(57) ABSTRACT

A cover window of a flexible display device includes a base film, a support layer on the base film, and a bead layer on the support layer. The bead layer includes a plurality of beads distributed at a surface of the cover window and a binder for binding the beads. A portion of at least one bead of the beads is exposed to outside.

17 Claims, 10 Drawing Sheets

(56) References Cited

U.S. PATENT DOCUMENTS

| | | | | |
|---|---|---|---|---|
| 2012/0114518 A1* | 5/2012 | Hara | ............. | B29C 70/606 |
| | | | | 419/66 |
| 2012/0164413 A1* | 6/2012 | Hara | ............. | B29C 70/606 |
| | | | | 428/212 |
| 2012/0281292 A1* | 11/2012 | Baca | ............. | C03C 17/007 |
| | | | | 359/601 |
| 2013/0034685 A1 | 2/2013 | An et al. | | |
| 2016/0017076 A1* | 1/2016 | Inoue | ............. | C08F 216/125 |
| | | | | 522/64 |
| 2016/0026061 A1* | 1/2016 | O'Keeffe | ............. | G02F 1/167 |
| | | | | 359/296 |
| 2017/0036242 A1* | 2/2017 | Lee | ............. | B05D 1/005 |
| 2017/0050349 A1* | 2/2017 | Hara | ............. | B29C 70/606 |
| 2017/0253707 A1* | 9/2017 | Lim | ............. | C08J 7/042 |

* cited by examiner

1cm PEN DROP

2cm PEN DROP

3cm PEN DROP

STEEL WOOL SCRATCH

COVER WINDOW OF A FLEXIBLE DISPLAY DEVICE AND METHOD OF MANUFACTURING A COVER WINDOW OF A FLEXIBLE DISPLAY DEVICE

CROSS REFERENCE TO RELATED APPLICATION

This application claims priority to and the benefit of Korean Patent Applications No. 10-2017-0069037, filed on Jun. 2, 2017 in the Korean Intellectual Property Office (KIPO), the entire content of which is incorporated herein by reference.

BACKGROUND

1. Field

Example embodiments of the present disclosure relate to display devices. For example, example embodiments of the present disclosure relate to cover windows of flexible display devices and methods of manufacturing the cover windows of the flexible display devices.

2. Discussion of Related Art

A flexible display device has been recently developed that has a flexible substrate or film made of a bendable material such as a plastic such that the flexible display device may be bent. Such a flexible display device includes a flexible display panel and a cover window for protecting the flexible display panel. Instead of a glass substrate or a high hardness substrate of a cover window of an existing flat display device, the cover window of the flexible display device may use a thin film, thereby having flexibility. However, the cover window using the thin film may have poor impact resistance. For example, when performing a pen-drop experiment at a height of about 2 cm or about 1 cm, damage, such as a dent or a crack, may occur at a surface of the cover window, and a white spot or a black spot may occur at the display panel.

SUMMARY

Example embodiments provide a cover window of a flexible display device having improved impact resistance and surface characteristics.

Example embodiments provide a method of manufacturing a cover window of a flexible display device having improved impact resistance and surface characteristics.

According to example embodiments, a cover window of a flexible display device includes a base film, a support layer on the base film, and a bead layer on the support layer. The bead layer includes a plurality of beads distributed at a surface of the cover window and a binder for binding the beads. A portion of at least one bead of the beads is exposed to outside.

In example embodiments, the beads may be configured to block (e.g., reduce or blunt) and support an impact from the outside, the binder may be configured to absorb and disperse the impact transferred through (e.g., from) the beads, and the support layer may be configured to block (e.g., reduce or blunt) and support the impact transferred through (e.g., from) the binder.

In example embodiments, the portion of the at least one bead exposed to the outside corresponds to about 10% to about 70% of a particle diameter of the at least one bead exposed to the outside.

In example embodiments, the beads may have an average particle diameter of about 5 nm to about 1 μm.

In example embodiments, the beads may include silica, glass, diamond and/or aluminum oxide.

In example embodiments, a concentration of the beads in the bead layer may be from about 1 wt % to about 80 wt %, based on the total weight of the bead layer.

In example embodiments, the beads and the binder may have a refractive index difference less than about 0.1.

In example embodiments, the bead layer may have a haze less than or equal to about 5%, and may have a light transmittance greater than or equal to about 85%.

In example embodiments, the binder may include an acrylic compound, a urethane compound, and/or a silicon compound.

In example embodiments, the binder may have a compression modulus of about 10 MPa to about 2,000 MPa, and may have a compression restoration rate greater than or equal to about 70%.

In example embodiments, the support layer may include an acrylic compound, a urethane compound, and/or a silicon compound.

In example embodiments, the support layer may have a compression modulus of about 1,000 MPa to about 8,000 MPa, and may have a compression restoration rate greater than or equal to about 50%.

In example embodiments, the binder may have a compression modulus lower than a compression modulus of the support layer.

In example embodiments, the binder may have a thickness of about 3 nm to about 200 nm, and the support layer may have a thickness of about 5 μm to about 50 μm.

According to example embodiments, a cover window of a flexible display device includes a base film, a support layer on the base film, and a bead layer on the support layer. The bead layer includes a plurality of beads distributed at a surface of the cover window and a binder for binding the beads. The beads are embedded in the binder, and are located adjacent to a surface of the binder that forms the surface of the cover window.

In example embodiments, the beads may be formed as a single (or sole) layer in the binder.

According to example embodiments, in a method of forming a cover window of a flexible display device, a base film is formed, a support layer is formed on the base film, and a bead layer is formed on the support layer. The bead layer includes a plurality of beads distributed at a surface (or only one surface) of the cover window and a binder for binding the beads. A portion of at least one bead of the beads is exposed to outside.

In example embodiments, the beads may be configured to block (e.g., reduce or blunt) and support an impact from the outside, the binder may be configured to absorb and disperse the impact transferred through (e.g., from) the beads, and the support layer may be configured to block (e.g., reduce or blunt) and support the impact transferred through (e.g., from) the binder.

In example embodiments, to form the support layer on the base film, the support layer may be coated on the base film, and the support layer coated on the base film may be hardened.

In example embodiments, to form the bead layer on the support layer, the bead layer may be coated on the support layer, and the bead layer coated on the support layer may be hardened.

As described above, the cover window of the flexible display device according to example embodiments and the cover window manufactured by the method of manufacturing the cover window of the flexible display device according to example embodiments may include a plurality of beads distributed at a surface (or only one surface) of the cover window. A portion of each of the plurality of beads may be exposed to the outside, or the plurality of beads may be located adjacent to the surface of the cover window or may be in contact (e.g., physical contact) with the surface of the cover window. Therefore, the impact resistance and the surface characteristics of the cover window of the flexible display device may be improved.

BRIEF DESCRIPTION OF THE DRAWINGS

Example embodiments can be understood in more detail from the following description taken in conjunction with the accompanying drawings, in which.

DETAILED DESCRIPTION

Exemplary embodiments will be described more fully hereinafter with reference to the accompanying drawings, in which various embodiments are shown.

Figure 1:
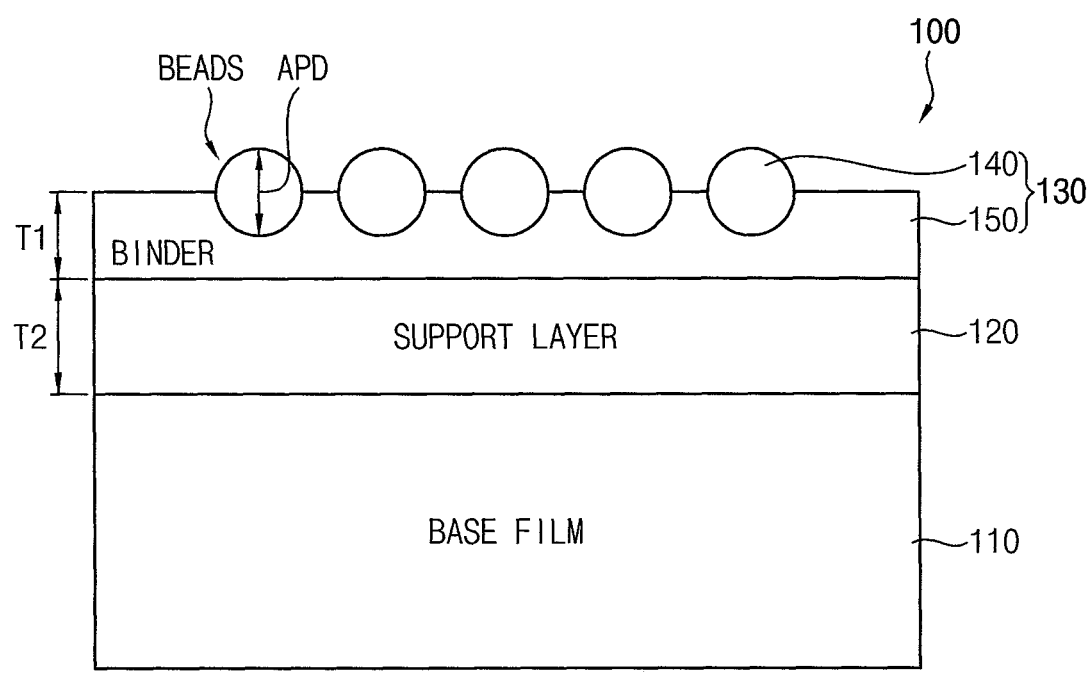
FIG. 1 is a cross-sectional view of a cover window of a flexible display device according to example embodiments.
Figure 2A:
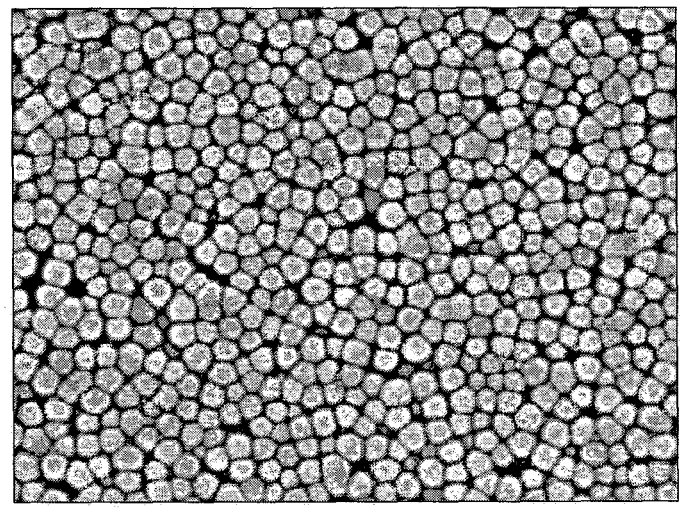
FIG. 2A is a top view of a portion of a cover window of a flexible display device of FIG. 1.
Figure 2B:
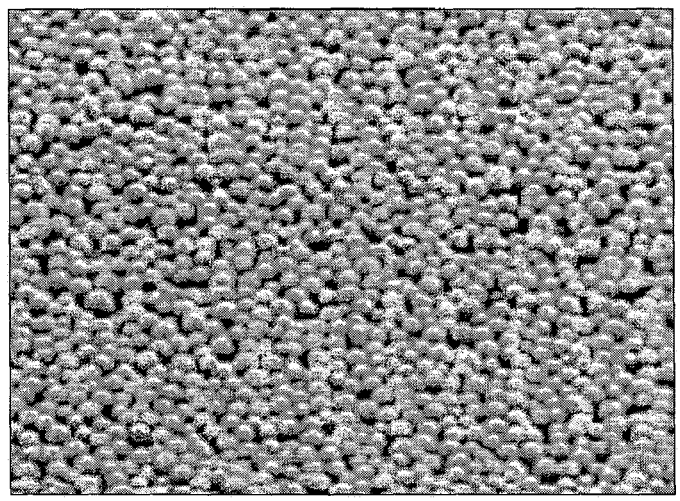
FIG. 2B is a perspective top view of a portion of a cover window of a flexible display device of FIG. 1.

FIG. 1 is a cross-sectional view of a cover window of a flexible display device according to example embodiments, FIG. 2A is a top view of a portion of a cover window of a flexible display device of FIG. 1, and FIG. 2B is a perspective top view of a portion of a cover window of a flexible display device of FIG. 1.

Referring to FIG. 1, a cover window 100 of a flexible display device includes a base film 110, a support layer 120 on the base film 110, and a bead layer 130 on the support layer 120.

The base film 110 may be implemented with a transparent plastic film or thin glass film having flexibility. In some example embodiments, the base film 110 may be formed by materials having good optical characteristic, high hardness, high flexibility, and high elastic recovery. For example, the base film 110 may include polyethylene-terephthalate (PET), polycarbonate (PC), polyimide (PI), thermoplastic urethane (TPU), a combination thereof, or the like. As used herein, the terms "combination thereof" and "combinations thereof" may refer to a chemical combination (e.g., an alloy or chemical compound), a mixture, or a laminated structure of components. In some example embodiments, the base film 110 may have, but is not limited to, a thickness of about 20 μm to about 100 μm.

The support layer 120 may be formed by slit-coating an acrylic compound, a urethane compound, a silicon compound, a combination thereof, or the like on the base film 110. However, the method of forming the support layer 120 is not limited to the slit-coating, and, in some example embodiments, the support layer 120 may be formed by dipping coating, spin coating, spray coating, vacuum deposition, etc. In some example embodiments, the support layer 120 may include an acrylic compound, a urethane compound, a silicon compound, a combination thereof, or the like, may have a compression modulus of about 1,000 MPa to about 8,000 MPa, and may have a compression restoration rate greater than or equal to about 50%. In some example embodiments, the support layer 120 may be a hard coating layer, but the support layer is not limited to a hard coating layer. Further, in some example embodiments, the support layer 120 may have, but is not limited to, a thickness T2 of about 5 μm to about 50 μm.

The bead layer 130 may be formed by, but is not limited to, slit-coating a binder 150 containing a plurality of beads 140 on the support layer 120. The bead layer 130 formed on the support layer 120 may include the plurality of beads 140 distributed at a surface (e.g., a top surface or only the top surface) of the cover window 100 and the binder 150 for binding the beads 140. In some example embodiments, a concentration of the beads 140 in the bead layer 130 may range from about 1 wt % to about 80 wt %, based on the total weight of the bead layer. In some example embodiments, the beads and the binder have a refractive index difference less than about 0.1. Further, in some example embodiments, the bead layer 130 including the beads 140 and the binder 150 may have a haze less than or equal to about 5%, and may have a light transmittance greater than or equal to about 85%. In some example embodiments, the beads 140 may have, but the beads are not limited to, an average particle diameter (APD) of about 5 nm to about 1 μm, and the binder 150 may have, but the binder is not limited to, a thickness T1 of about 3 nm to about 200 nm.

The beads 140 may include silica, glass, diamond, aluminum oxide, a combination thereof, or the like. For example, in some embodiments, each bead 140 (or a portion of the beads 140) may be implemented as an empty spherical particle having a surface of silica and an empty interior. In another example, each bead 140 (or a portion of the beads 140) may be implemented as a spherical particle having a surface of silica and filled with the silica. However, the structure of each bead 140 is not limited thereto. These beads 140 may have a high elastic modulus (e.g., an elastic modulus of about a few tens GPa) and high rigidity.

The binder 150 may include an acrylic compound, a urethane compound a silicon compound, a combination thereof, or the like. The binder 150 may have a compression modulus of about 10 MPa to about 2,000 MPa, and may have a compression restoration rate greater than or equal to about 70%. In some example embodiments, the binder 150 may have a compression modulus lower than a compression modulus of the support layer 120, and thus may have high flexibility.

A portion of at least one bead of the beads 140 may be exposed to the outside. In some example embodiments, the portion of the at least one bead exposed to the outside corresponds to about 10% to about 70% of an average particle diameter (APD) of the at least one bead exposed to the outside, and the remaining portion of the at least one bead may be combined with the binder 150 (e.g., may be adhered to and/or at least partially surrounded by the binder 150). Thus, as a top view image 200a of the cover window 100 illustrated in FIG. 2A and as a perspective top view image 200b of the cover window 100 illustrated in FIG. 2B, the cover window 100 according to example embodiments may have a top surface (e.g., a surface opposite to a surface adjacent to a display panel of the flexible display device) at which all, substantially all, or a portion of the beads 140 are exposed to the outside. Thus, an impact from the outside may be first applied not to the binder 150 or the support layer 120 but to the beads 140 having the high elastic modulus (e.g., an elastic modulus of about a few tens GPa) and the high rigidity, and the beads 140 may block (e.g., reduce or blunt) and/or support the impact from the outside. Further, since the binder 150 has higher flexibility than the support layer 120, and the bead layer 130 has a structure where another portion (other than the exposed portion) of each bead 140 is surrounded by the binder 150, the impact transferred through (e.g., from) the beads 140 may be absorbed and/or dispersed by the binder 150. In addition, the support layer 120 may further block (e.g., reduce or blunt) and/or support the impact transferred through (e.g., from) the binder 150, and thus the impact may almost not be transmitted to the base film 110 and a display panel under the cover window 100. Accordingly, an impact resistance of the cover window 100 of the flexible display device according to example embodiments may be improved.

Further, since the cover window 100 has the top surface where all, substantially all, or a portion of the beads 140 are exposed to the outside, even if the cover window 100 is scratched, the beads 140 may prevent a scratching object from directly contacting the binder 150 (or may reduce a likelihood or amount of such direct contact), and thus the scratch mark may not remain at the surface of the cover window 100 (or a degree or amount of such scratch mark may be reduced). Accordingly, surface characteristics of the cover window 100 of the flexible display device according to example embodiments may be improved.

As described above, in the cover window 100 of the flexible display device according to example embodiments, the beads 140 having high rigidity may serve as a barrier/ supporter for impacts, the binder 150 having flexibility may serve as an absorber/disperser for the impact, and the support layer 120 may serve as a barrier/supporter for the impact. Accordingly, the cover window 100 may have improved impact resistance. In addition, the cover window 100 may have a top surface at which the beads 140 are exposed to the outside, thereby improving the surface characteristics of the cover window 100 of the flexible display device according to example embodiments.

Figure 3:
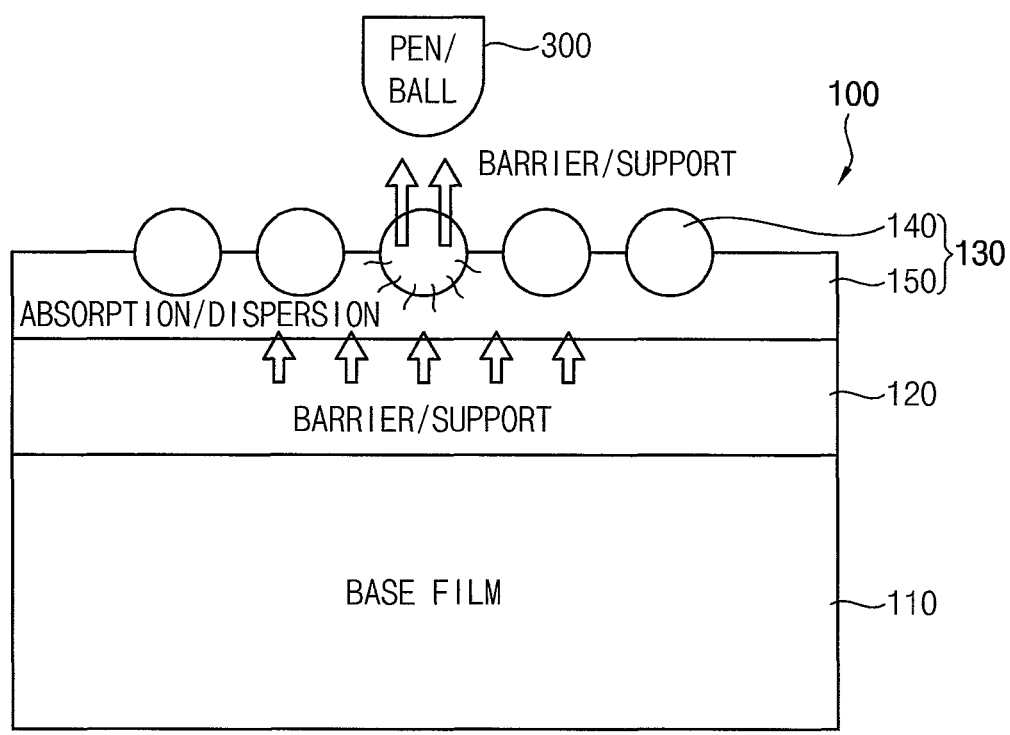
FIG. 3 is a diagram illustrating describing impact resistance of a cover window of a flexible display device according to example embodiments.
Figure 4A:
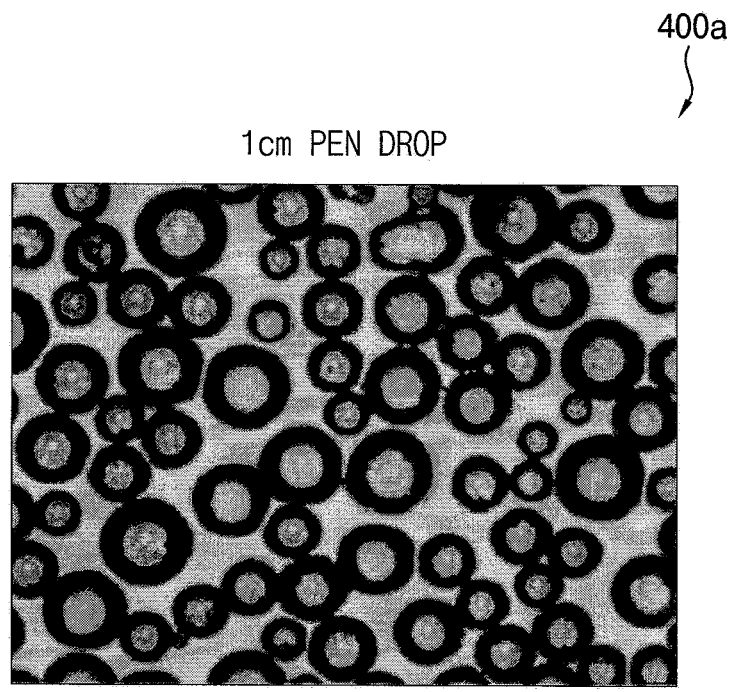
FIG. 4A is a diagram illustrating a microscopic image of an example of a cover window of a flexible display device after a pen-drop at a height of about 1 cm.
Figure 4B:
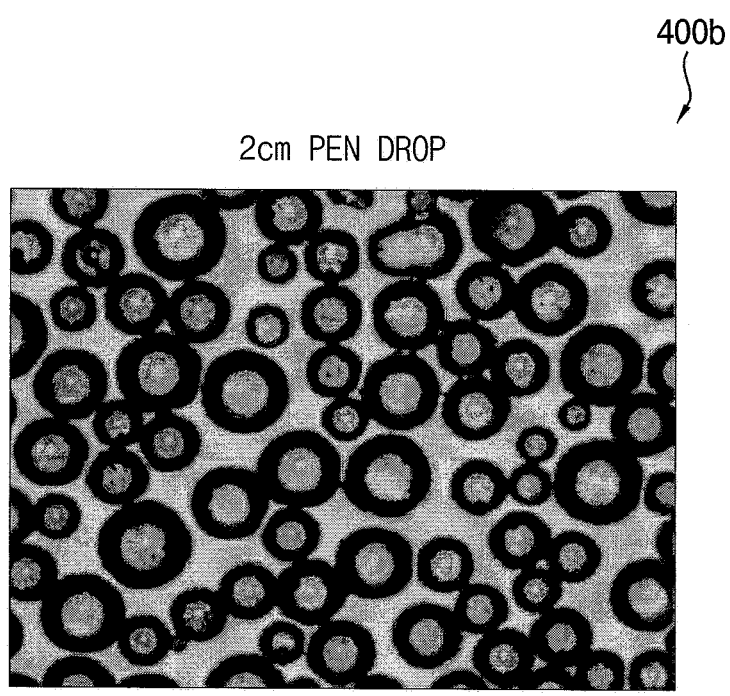
FIG. 4B is a diagram illustrating a microscopic image of an example of a cover window of a flexible display device after a pen-drop at a height of about 2 cm.
Figure 4C:
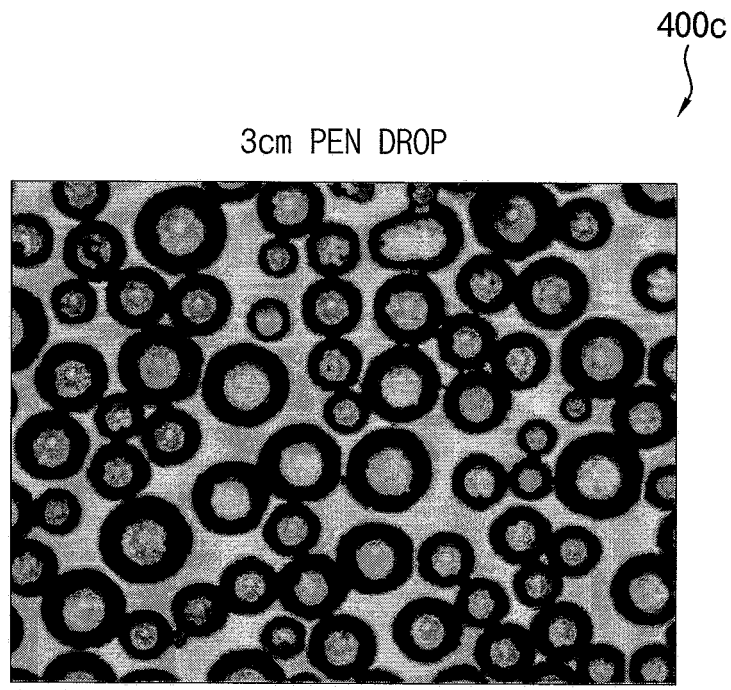
FIG. 4C is a diagram illustrating a microscopic image of an example of a cover window of a flexible display device after a pen-drop at a height of about 3 cm.

FIG. 3 is a diagram for describing impact resistance of a cover window of a flexible display device according to example embodiments, FIG. 4A is a diagram illustrating a microscopic image of an example of a cover window of a flexible display device after a pen-drop at a height of about 1 cm, FIG. 4B is a diagram illustrating a microscopic image of an example of a cover window of a flexible display device after a pen-drop at a height of about 2 cm, and FIG. 4C is a diagram illustrating a microscopic image of an example of a cover window of a flexible display device after a pen-drop at a height of about 3 cm.

Referring to FIG. 3, if an impact, such as a pen-drop (or a ball-drop), occurs to a cover window 100 of a flexible display device, the impact by the drop of a pen 300 may be first applied to exposed beads 140. The beads 140 having high elastic modulus and high rigidity may serve as a barrier that blocks (e.g., reduces or blunts) the impact by the drop of the pen 300 and/or a supporter that supports the impact by the drop of the pen 300. Since another portion (other than an exposed portion) of each bead 140 is surrounded by the binder 150, and the binder 150 has flexibility, the binder 150 may serve as an absorber that absorbs the impact transferred through (e.g., from) the beads 140 and/or a disperser that disperses the impact transferred through (e.g., from) the beads 140. In addition, a support layer 120 may also serve as the barrier and/or the supporter for the impact transferred through (e.g., from) the binder 150.

An existing cover window for a flexible display device has poor impact resistance to have flexibility. For example, when performing a pen-drop experiment even at a height of about 2 cm or about 1 cm, damage, such as a dent or a crack, may occur at a surface of the cover window, and a white spot or a black spot may occur at the display panel. However, in the cover window 100 of the flexible display device according to example embodiments, the beads 140 having high rigidity may serve as a barrier/supporter for the impact, the binder 150 having flexibility may serve as an absorber/ disperser for the impact, and the support layer 120 may serve as a barrier/supporter for the impact, thereby improving the impact resistance of the cover window 100. For example, with respect to the cover window 100 of the flexible display device according to example embodiments, as a microscopic image 400a of the cover window 100 illustrated in FIG. 4A after a drop of the pen 300 having a diameter of about 0.7 mm at a height of about 1 cm, a microscopic image 400b of the cover window 100 illustrated in FIG. 4B after a drop of the pen 300 at a height of about 2 cm, and a microscopic image 400c of the cover window 100 illustrated in FIG. 4C after a drop of the pen 300 at a height of about 3 cm, the dent or the crack at the surface (e.g., the top surface) of the cover window 100 may not occur, or may be invisible to the naked eye.

Figure 5:
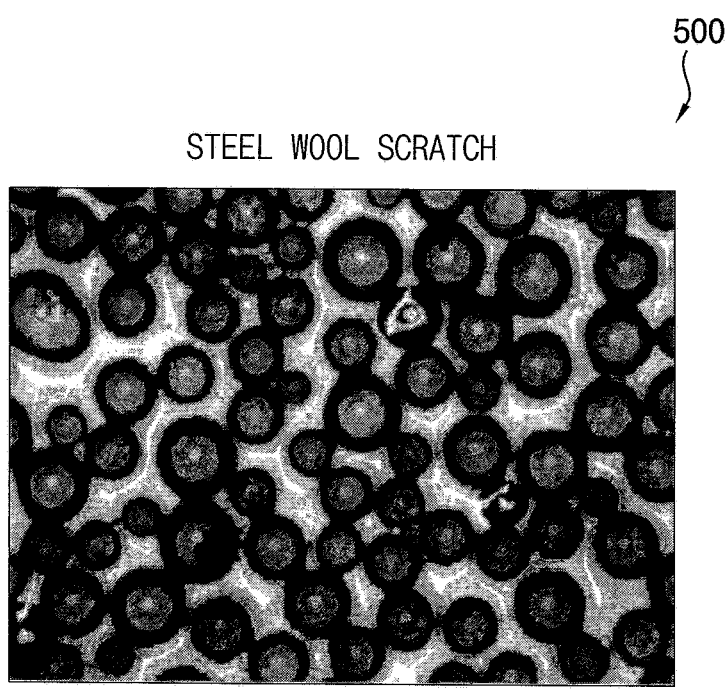
FIG. 5 is a diagram illustrating a microscopic image of an example of a cover window of a flexible display device after scratching the cover window about ten times with steel wool.

FIG. 5 is a diagram illustrating a microscopic image of an example of a cover window of a flexible display device after scratching the cover window about ten times with steel wool.

Referring to FIG. 5, although the cover window 100 is scratched about ten times with steel wool, in the cover window 100 of the flexible display device according to example embodiments, the beads 140 may almost not be damaged as a microscopic image 500 illustrated in FIG. 5. Further, since the beads 140 prevents the steel wool from directly contacting the binder 150 (or reduces a likelihood or amount of such direct contact), the scratch mark at the surface of the cover window 100 may not occur (or a degree or amount of such scratch mark may be reduced), or may be invisible to the naked eye.

Figure 6:
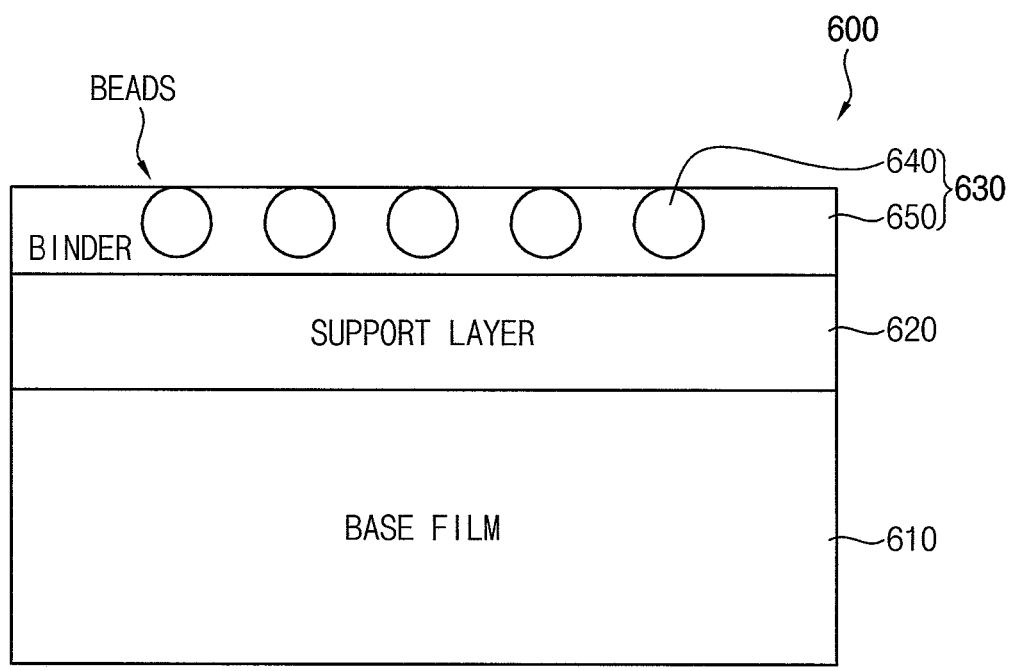
FIG. 6 is a cross-sectional view of a cover window of a flexible display device according to example embodiments.

FIG. 6 is a cross-sectional view of a cover window of a flexible display device according to example embodiments.

Referring to FIG. 6, a cover window 600 of a flexible display device includes a base film 610, a support layer 620 on the base film 610, and a bead layer 630 on the support layer 620. The bead layer 630 may include a plurality of beads 640 distributed at a surface (e.g., a top surface or only the top surface) of the cover window 600 and a binder 650 for binding the beads 640. The cover window 600 of FIG. 6 may have a structure the same or similar to that of a cover window 100 of FIG. 1, except that the beads 640 may not be exposed to the outside and may be embedded in the binder 650. Since the beads 640 are embedded in the binder 650, the beads 640 may be invisible when viewed from above.

In the cover window 600, the beads 640 may be located adjacent to a surface of the binder 650 that forms the surface (e.g., the top surface) of the cover window 600. In some example embodiments, as illustrated in FIG. 6, the beads 640 may be in contact with the surface of the binder 650, or the surface of the cover window 600. Thus, an impact from the outside may be applied to the beads 640 having high elastic modulus and high rigidity as well as (or instead of) the binder 650. Accordingly, the beads 640 having high rigidity may serve as a barrier/supporter for the impact, the binder 650 having flexibility may serve as an absorber/disperser for the impact, and the support layer 620 may serve as a barrier/supporter for the impact, thereby improving the impact resistance of the cover window 100.

In some example embodiments, the beads 640 may be formed, in the binder 650, as a single (e.g., sole) layer adjacent to the surface of the binder 650, or the surface of the cover window 600. In other example embodiments, the beads 640 may be formed as a plurality of layers including a layer adjacent to the surface of the binder 650, or the surface of the cover window 600.

Figure 7:
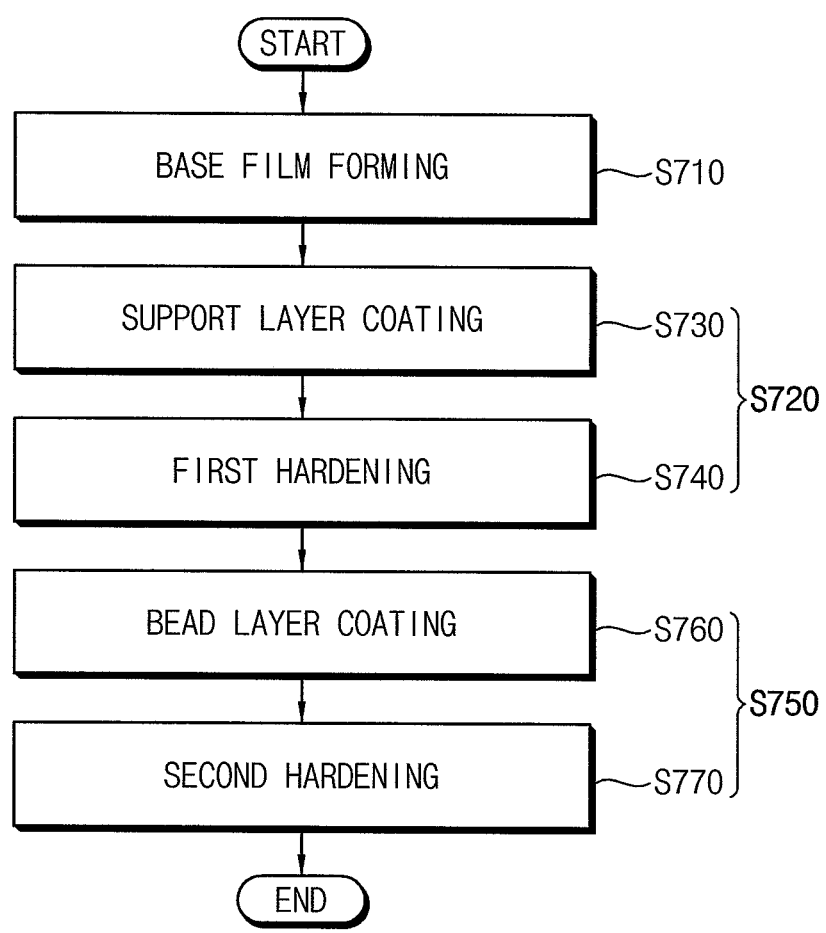
FIG. 7 is a flow chart illustrating a method of manufacturing a cover window of a flexible display device according to example embodiments.
Figure 8:
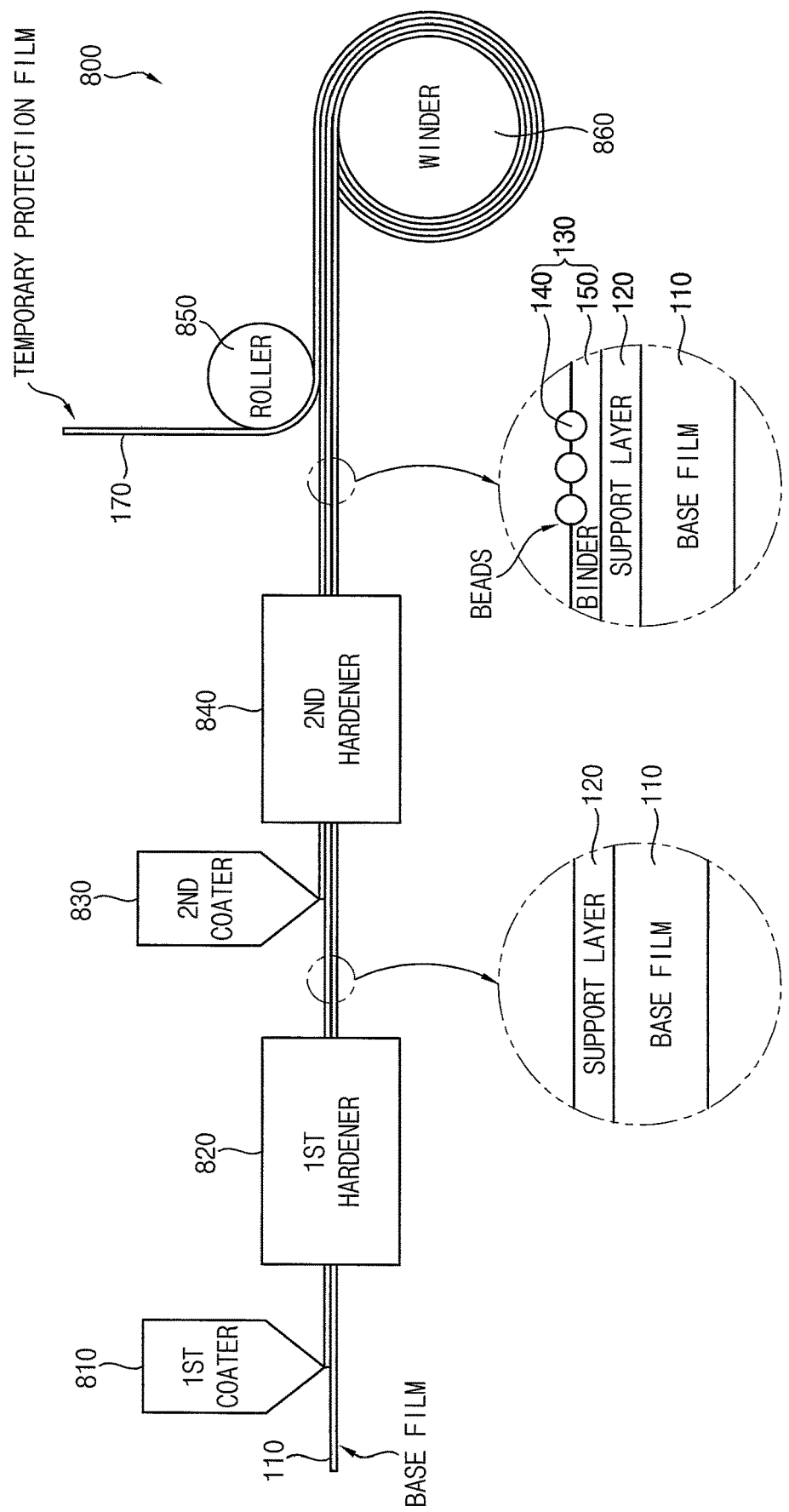
FIG. 8 is a diagram illustrating an example of a cover window manufacturing system for performing the method of FIG. 7.

FIG. 7 is a flow chart illustrating a method of manufacturing a cover window of a flexible display device according to example embodiments, and FIG. 8 is a diagram illustrating an example of a cover window manufacturing system performing the method of FIG. 7.

Referring to FIGS. 7 and 8, in a method of manufacturing a cover window of a flexible display device, a base film 110 may be formed (S710). In some example embodiments, the base film 110 may be implemented with a transparent plastic film or thin glass film having flexibility. For example, the base film 110 may include polyethylene-terephthalate (PET), polycarbonate (PC), polyimide (PI), thermoplastic urethane (TPU), a combination thereof, or the like. The base film 110 may be supplied to a cover window manufacturing system 800 of FIG. 8 that performs a roll-to-roll (R2) process. In some example embodiments, the cover window manufacturing system 800 may include a first coater 810, a first hardener 820, a second coater 830, a second hardener 840, a roller 850 and a winder 860.

A support layer 120 may be formed on the base film 110 (S720). In some example embodiments, the first coater 810 may coat an acrylic compound, a urethane compound, a silicon compound, a combination thereof, or the like as the support layer 120 on the base film 110 (S730), and the first hardener 820 may harden the support layer 120 coated on the base film 110 (S740). In some example embodiments, the first coater 810 may perform, but is not limited to, slit-coating. In some example embodiments, the first hardener 820 may perform, but is not limited to, a ultra-violet (UV) hardening process using a UV lamp or a dryer hardening process using heat.

A bead layer 130 including a plurality of beads 140 distributed at a surface (e.g., only one surface) of the cover window and a binder 150 for binding the beads 140 on the support layer 120 (S750). In some example embodiments, the second coater 830 may coat the binder 150 containing the beads 140 as the bead layer 130 on the support layer 120 (S760), and the second hardener 840 may harden the bead layer 130 coated on the support layer 120 (S770). According to example embodiments, by adjusting a speed of coating the binder 150 containing the beads 140 or by adjusting a thickness of the binder 150, the bead layer 130 where the beads 140 are exposed to the outside may be formed as illustrated in FIG. 1, or the bead layer 630 where the beads 640 are embedded in the binder 650 may be formed as illustrated in FIG. 6. In some example embodiments, the second coater 830 may perform, but is not limited to, slit-coating. In some example embodiments, the second hardener 840 may perform, but is not limited to, the hardening process or the dryer hardening process.

In the cover window manufactured as described above, the beads 140 may block (e.g., reduce or blunt) and/or support an impact from the outside, the binder 150 may absorb and/or disperse the impact, and the support layer 120 may block (e.g., reduce or blunt) and/or support the impact, thereby improving the impact resistance of the cover window. Further, cover window manufactured as described above may have improved surface characteristics.

After the bead layer 130 is formed, a temporary protection film 170 may be attached on the bead layer 130 to protect the bead layer 130 by using the roller 850, and the cover window to which the temporary protection film 170 is attached may be wound around the winder 860. The temporary protection film 170 may be removed when the cover window is attached to a display panel.

Although FIG. 8 illustrates an example of the cover window manufacturing system 800, the cover window manufacturing system 800 is not limited to the configuration illustrated in FIG. 8. For example, the cover window manufacturing system 800 may include one coater that is able to coat multiple layers instead of the two coaters 810 and 830, and/or may include one hardener instead of the two hardeners 820 and 840. In this case, the coating and/or hardening the support layer 120 and the bead layer 130 may be performed concurrently (e.g., at the same time).

Figure 9A:
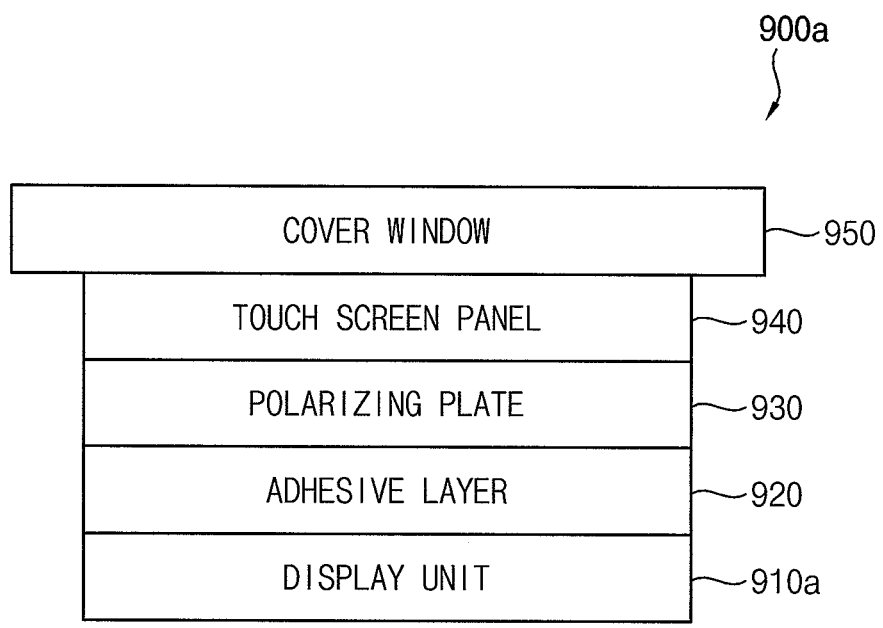
FIG. 9A is a diagram illustrating an example of a flexible display device including a cover window according to example embodiments.

FIG. 9A is a diagram illustrating an example of a flexible display device including a cover window according to example embodiments.

Referring to FIG. 9A, a flexible display device 900*a* may include a display unit 910*a*, an adhesive layer 920, a polarizing plate 930, a touch screen panel 940 and a cover window 950. According to example embodiments, the cover window 950 may be a cover window 100 of FIG. 1 or a cover window 600 of FIG. 6.

The display unit 910*a* may include optical elements for displaying an image. For example, the display unit 910*a* may include organic light emitting diodes (OLEDs) and/or liquid crystal display (LCD) elements. Further, in some example embodiments, the display unit 910*a* may include a substrate formed with a flexible resin. For example, the display unit 910*a* may include a flexible substrate, such as a PI substrate, a silicon substrate, a PC substrate, a polyacrylate substrate, a combination thereof, or the like.

The adhesive layer 920 may be used for the polarizing plate 930 to adhere to the display unit 910*a*. For example, adhesive layer 920 may be formed with an adhesive composite including an (meth)acrylate resin, a hardening agent, an initiator and/or a silane coupling agent.

The polarizing plate 930 may polarize internal light or prevent external light from being reflected (or a likelihood or amount of such reflection may be reduced) to implement displaying or improve a contrast of the flexible display device 900a. In an example, the polarizing plate 930 may be formed only by a polarizer. In some embodiments, the polarizing plate 930 may include the polarizer, and at least one protection film formed on one surface or both surfaces of the polarizer. In still another embodiment, the polarizing plate 930 may include the polarizer, and at least one protection coating layer formed on one surface or both surfaces of the polarizer.

The touch screen panel 940 may generate an electrical signal by sensing a change of capacitance caused when a conductor, such as a finger or a stylus, touches the touch screen panel 940. The touch screen panel 940 may be formed by patterning flexible and conductive conductors. The conductors for the touch screen panel 940 may include a metal nano wire, a conductive polymer, a carbon nano tube, a combination thereof, or the like, but the conductors are not limited thereto.

The cover window 950 may be formed as the most outer component of the flexible display device 900a to protect the flexible display device 900a. The cover window 950 may include a plurality of beads distributed at a surface (e.g., a top surface or only the top surface) of the cover window 950, and the beads may be located such that the beads are exposed to the outside or such that the beads are adjacent to (or in contact with) the surface, thereby improving impact resistance and surface characteristics of the cover window 950.

Although it is not illustrated in FIG. 9A, an adhesive layer may be further formed between the polarizing plate 930 and the touch screen panel 940 and/or between the touch screen panel 940 and the cover window 950.

Figure 9B:
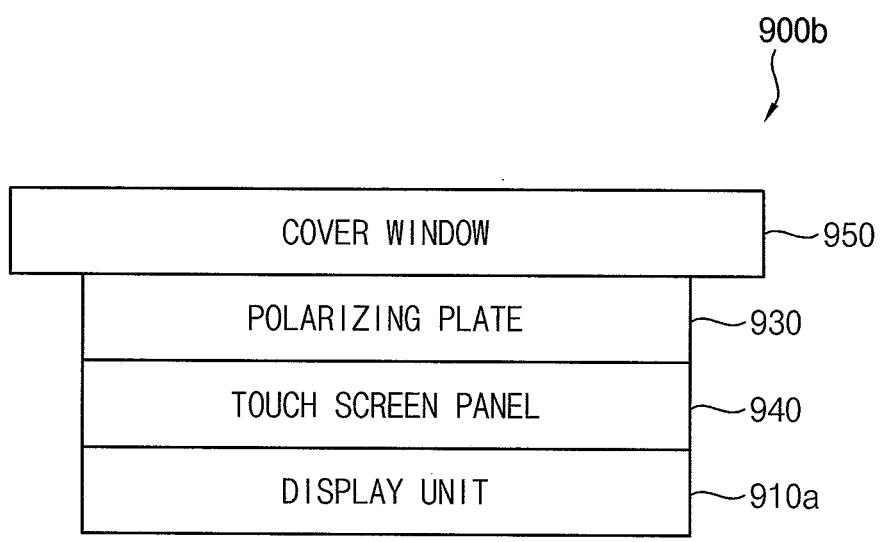
FIG. 9B is a diagram illustrating another example of a flexible display device including a cover window according to example embodiments.

FIG. 9B is a diagram illustrating another example of a flexible display device including a cover window according to example embodiments.

Referring to FIG. 9B, a flexible display device 900b may include a display unit 910a, a touch screen panel 940, a polarizing plate 930 and a cover window 950. The flexible display device 900b of FIG. 9B may have the same or similar structure as a flexible display device 900a of FIG. 9A, except that the touch screen panel 940 is formed directly on the display unit 910a. Since the touch screen panel 940 is formed directly on the display unit 910a, the flexible display device 900b may have more thin thickness (e.g., may be thinner). Further, the touch screen panel 940 may be formed directly on the display unit 910a by a deposition process, but the method of manufacturing the touch screen panel 940 is not limited to the deposition process.

Although it is not illustrated in FIG. 9B, an adhesive layer may be further formed between the display unit 910a and the touch screen panel 940, between the touch screen panel 940 and the polarizing plate 930, and/or between the polarizing plate 930 and the cover window 950.

Figure 9C:
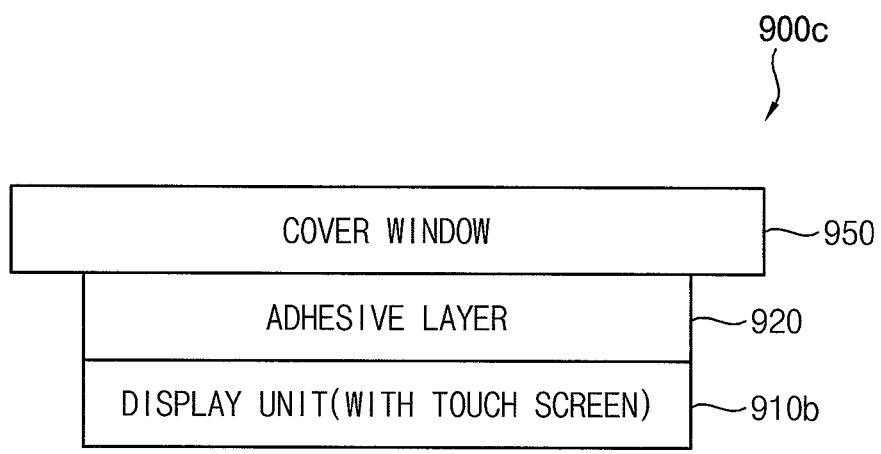
FIG. 9C is a diagram illustrating a still another example of a flexible display device including a cover window according to example embodiments.

FIG. 9C is a diagram illustrating a still another example of a flexible display device including a cover window according to example embodiments.

Referring to FIG. 9C, a flexible display device 900c may include a display unit 910b, an adhesive layer 920 and a cover window 950. In the flexible display device 900c of FIG. 9C, the display unit 910b may include not only a flexible substrate and optical elements, such as OLEDs, formed on the flexible substrate, but also a touch screen panel formed inside the display unit 910b.

The present embodiments may be applied to any suitable flexible display device (e.g., applied to a cover window of the flexible display device).

The foregoing is illustrative of example embodiments, and is not to be construed as limiting thereof. Although certain example embodiments have been described herein, those skilled in the art will readily appreciate that many modifications are possible in the example embodiments without materially departing from the spirit and scope of the present disclosure. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and the present disclosure is not to be construed as being limited to the embodiments disclosed, herein and that modifications to the disclosed example embodiments, as well as other example embodiments, are intended to be included within the scope of the appended claims, and equivalents thereof.

What is claimed is:

1. A cover window of a flexible display device comprising:
   a base film;
   a support layer on the base film; and
   a bead layer on the support layer, the bead layer including a plurality of beads distributed at a surface of the cover window and a binder for binding the beads,
   wherein the beads are in contact with a surface of the cover window, and are embedded in the binder such that the beads are not exposed to outside and the surface of the cover window is flat,
   wherein the binder has a compression modulus lower than a compression modulus of the support layer, and
   wherein the beads are configured to reduce and support an impact from the outside.

2. The cover window of claim 1,
   wherein the binder is configured to absorb and disperse the impact transferred from the beads, and
   wherein the support layer is configured to reduce and support the impact transferred from the binder.

3. The cover window of claim 1, wherein the beads have an average particle diameter of about 5 nm to about 1 µm.

4. The cover window of claim 1, wherein the beads include glass or diamond.

5. The cover window of claim 1, wherein a concentration of the beads in the bead layer is from about 1 wt % to about 80 wt %, based on the total weight of the bead layer.

6. The cover window of claim 1, wherein the beads and the binder have a refractive index difference less than about 0.1.

7. The cover window of claim 1, wherein the bead layer has a haze less than or equal to about 5%, and has a light transmittance greater than or equal to about 85%.

8. The cover window of claim 1, wherein the binder comprises at least one selected from the group consisting of an acrylic compound, a urethane compound, and a silicon compound.

9. The cover window of claim 1, wherein the binder has a compression modulus of about 10 MPa to about 2,000 MPa.

10. The cover window of claim 1, wherein the support layer comprises at least one selected from the group consisting of an acrylic compound, a urethane compound, and a silicon compound.

11. The cover window of claim 1, wherein the support layer has a compression modulus of about 1,000 MPa to about 8,000 MPa.

12. The cover window of claim 1, wherein the binder has a thickness of about 3 nm to about 200 nm, and
wherein the support layer has a thickness ranging from about 5 μm to about 50 μm.

13. The cover window of claim 1, wherein the beads are formed as a single layer in the binder.

14. A method of forming a cover window of a flexible display device, the method comprising:
forming a base film;
forming a support layer on the base film; and
forming a bead layer on the support layer, the bead layer including a plurality of beads distributed at a surface of the cover window and a binder for binding the beads, wherein the beads are in contact with a surface of the cover window, and are embedded in the binder such that the beads are not exposed to outside and the surface of the cover window is flat,
wherein the binder has a compression modulus lower than a compression modulus of the support layer, and
wherein the beads are configured to reduce and support an impact from the outside.

15. The method of claim 14,
wherein the binder is configured to absorb and disperse the impact transferred from the beads, and
wherein the support layer is configured to reduce and support the impact transferred from the binder.

16. The method of claim 14, wherein forming the support layer on the base film comprises:
coating the support layer on the base film; and
hardening the support layer coated on the base film.

17. The method of claim 14, wherein forming the bead layer on the support layer comprises:
coating the bead layer on the support layer; and
hardening the bead layer coated on the support layer.

* * * * *